United States Patent [19]

Sone et al.

[11] Patent Number: 4,847,846
[45] Date of Patent: Jul. 11, 1989

[54] SEMICONDUCTOR LASER CHIP
[75] Inventors: Haruo Sone; Isao Umezawa; Osamu Yoneyama, all of Kanagawa, Japan
[73] Assignee: Sony Corporation, Tokyo, Japan
[21] Appl. No.: 182,200
[22] Filed: Mar. 7, 1988
[30] Foreign Application Priority Data
Mar. 25, 1987 [JP] Japan .............................. 62-072565
[51] Int. Cl.[4] .......................... H01S 3/19; H01S 3/18; H01L 31/12
[52] U.S. Cl. ....................................... 372/50; 372/43; 357/19
[58] Field of Search ....................... 372/50, 43; 357/19
[56] References Cited
FOREIGN PATENT DOCUMENTS
0200583 11/1983 Japan ..................................... 357/19
0198885 10/1985 Japan ..................................... 372/50
0206286 9/1986 Japan ..................................... 372/43

Primary Examiner—William L. Sikes
Assistant Examiner—Georgia Y. Epps

[57] ABSTRACT

A semiconductor laser comprising a laser diode which is mounted on a semiconductor chip which has a monitoring photodiode formed therein so as to monitor the laser light output of the laser diode. The cathode of the laser diode and the anode of the monitoring photodiode are connected together, and a suitable forward voltage for the laser diode and reverse voltage for the monitor photodiode is provided by a single power supply which results in a simple construction of an output detection circuit for the monitor photodiode which produces an increased output over prior art devices.

4 Claims, 3 Drawing Sheets

FIG. 5
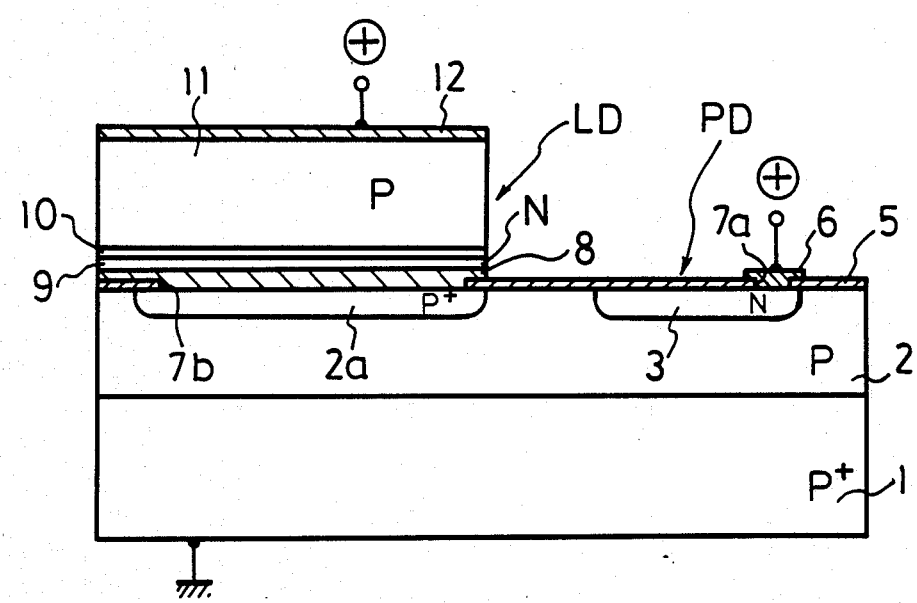
FIG. 1A
(PRIOR ART)
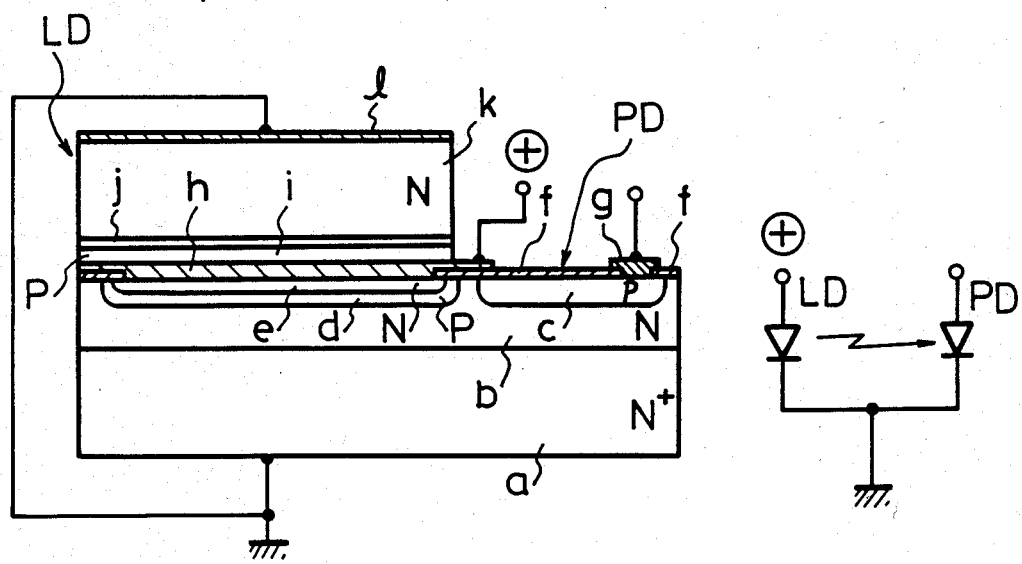
FIG. 1B
(PRIOR ART)

SEMICONDUCTOR LASER CHIP

CROSS-REFERENCE TO RELATED APPLICATIONS

This application is related to U.S. Pat. No. 4,736,231 entitled "Semiconductor Laser Device" in which the inventors are Masaaki Ayabe, Sumio Santa and Osamu Matsuda assigned to the assignee of the present application.

BACKGROUND OF THE INVENTION

1. Field of the Invention

This invention relates to a semiconductor laser and particularly to a semiconductor laser which has a monitoring photodiode.

2. Description of the Related Art

Semiconductor lasers which are to be used for reading a signal recorded on a compact disc player, a laser disc player and so on generally comprises a laser diode for the generation of a laser light beam and a photodiode so as to monitor the laser light beam in order to control the intensity of the laser light beam to keep it constant.

A semiconductor laser with a monitor photodiode is shown generally in, for example, U.S. Pat. No. 4,736,231 assigned to the assignee of the present application, and in U.S. Pat. Nos. 4,604,753 and 4,450,565.

FIGS. 1A and 1B show an example of a conventional semiconductor laser. FIG. 1A is a cross-sectional view and FIG. 1B is a circuit diagram. FIG. 1A shows an $N^+$-type silicon semiconductor substrate a, upon which is epitaxially grown an N-type layer b. A P-type diffusion region c is selectively formed in the surface of the epitaxially-grown layer b and serves as the anode of a photodiode PD. Also, a P-type diffusion region d is selectively formed in the surface of the epitaxially-grown layer b, and an N-type diffusion region e is selectively formed in the surface of the P-type diffusion region d. An oxide film f is formed on the surface of the semiconductor and two windows are formed in the oxide film f by selective etching. An electrode g is connected through one of the windows to the P-type diffusion region c. An electrode h is connected through the other window to the N-type diffusion region e and serves as the anode electrode of the laser diode LD. The laser diode LD is bonded to the electrode h, and includes a P-type semiconductor layer i of the laser diode LD, an active layer j, an N-type semicondcutor substrate k of the laser diode LD, and an electrode l. The electrode l is electrically connected to the semiconductor substrate a which is connected to the N-type epitaxially-grown layer b through another window in the oxide film f on the N-type epitaxially-grown layer -b).

The semiconductor laser has a circuit formed of the laser diode LD and the photodiode PD and their cathodes are connected together as shown in FIG. 1B.

So as to excite the laser diode LD, a forward voltage is necessary and the photodiode PD which receives the laser light from the laser diode LD is preferably supplied with a reverse bias voltage. In such conventional semiconductor laser, however, since the cathodes of the laser diode LD and photodiode PD are connected as illustrated in FIG. 1B, it is not possible to apply a forward voltage to the laser diode LD and a reverse voltage to the photodiode PD from a single power supply.

Therefore, in a conventional semiconductor laser which is driven by a single power supply, the photodiode PD has inevitably operated with no bias, and is not supplied with a reverse bias voltage, while the laser diode LD has been supplied with a forward voltage. FIG. 2 shows a light detecting circuit in which the photodiode PD can operate with no bias. This circuit has a resistor R connected across the photodiode PD so as to form a closed circuit and an operational amplifier OPA is connected to the resistor R so as to amplify the voltage drop developed across the resistor R when a photocurrent I flows from the photodiode PD to the resistor.

The photodiode PD has the voltage-current characteristic shown in FIG. 3.

In FIG. 3, curve A shows the V-I characteristics of the photodiode when it is not receiving light energy, and curve B shows the V-I characteristics when light energy is being received by the photodiode. Curve R shows the resistance value so as to obtain an acceptable photodetection output with linear response characteristics. FIG. 3 illustrates that the linear operation range in which the relationship between the light energy input and the output signal is linear is 0.2 V or below. Therefore, the range in which the output voltage changes in proportion to the input light energy is too small for APC (automatic power control) to be easily accomplished so as to maintain the output of the laser diode LD constant.

Also, since the light energy detection voltage obtained from the light energy detecting circuit of FIG. 2 is about 0.2 V or below, an ordinary transistor amplifying circuit cannot detect and amplify the voltage satisfactorily. Thus, manufactures have been required to use complicated and high-performance amplifiers such as an operational amplifier OPA. This results in increasing the cost of the optical pickup of the semiconductor laser, which is undesirable.

Users of such pickups have thought that the photodiode PD should be supplied with a reverse voltage for its operation, and they hesitate to operate the device with no bias and questions regarding performance have arisen.

SUMMARY OF THE INVENTION

It is an object of the present invention to provide a semiconductor laser so as to overcome the drawbacks of the prior art.

It is another object of the present invention to provide a semiconductor laser including a laser diode and a monitoring photodiode in which the laser diode and the photodiode can be supplied with forward and reverse voltages, respectively, from a single power supply.

It is further object of the present invention to provide a semiconductor laser including a laser diode and a monitoring photodiode in which the monitoring photodiode produces a large detected output.

It is still a further object of the present invention to provide a semiconductor laser which can be constructed with a simplified manufacturing process.

According to one aspect of the present invention, there is provided a semiconductor laser which comprises a laser diode and a monitoring photodiode, each of which have a cathode and an anode, and in which an anode of one of the diodes is connected to the cathode of the other diode.

These and other objects, features and advantages of the present invention will become apparent from the following detailed description of the preferred embodiments taken in conjunction with the accompanying drawings, throughout which like reference numerals designate like elements and parts.

BRIEF DESCRIPTION OF THE DRAWINGS

FIG. 1A is a cross-sectional view of a conventional semiconductor laser;

FIG. 1B is a circuit diagram for the device of FIG. 1A;

FIG. 5 is a cross-sectional view of another embodiment of a semiconductor laser of this invention.

DESCRIPTION OF THE PREFERRED EMBODIMENTS

Different embodiments of semiconductor lasers of the invention will be described in detail with reference to the accompanying drawings.

Figure 2:
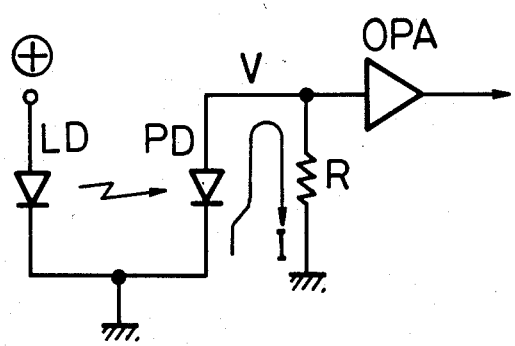
FIG. 2 is a circuit diagram of a light detecting circuit employed with the semiconductor laser shown in FIG 1A.
Figure 3:
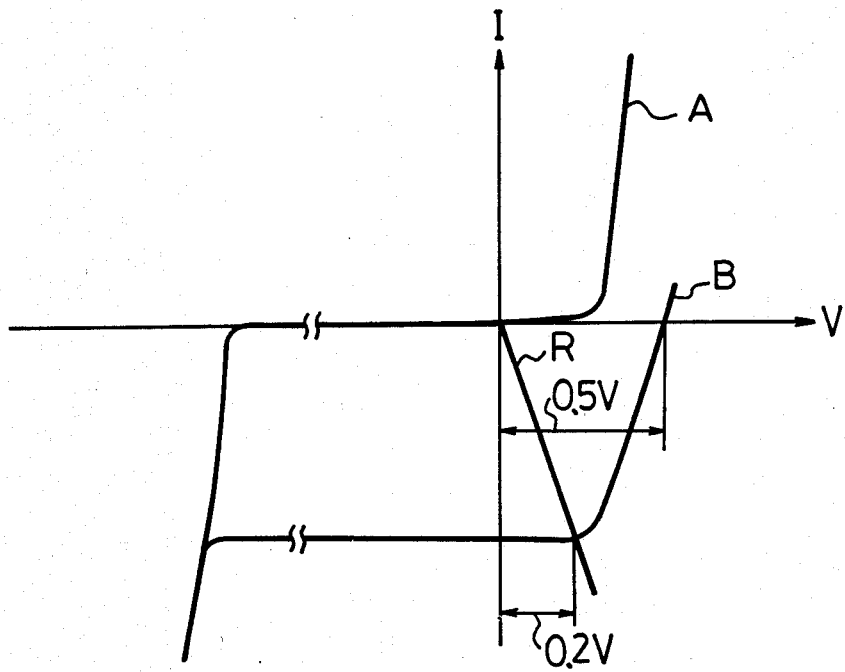
FIG. 3 is a diagram of a voltage-current characteristic of the photodiode.
Figure 4A:
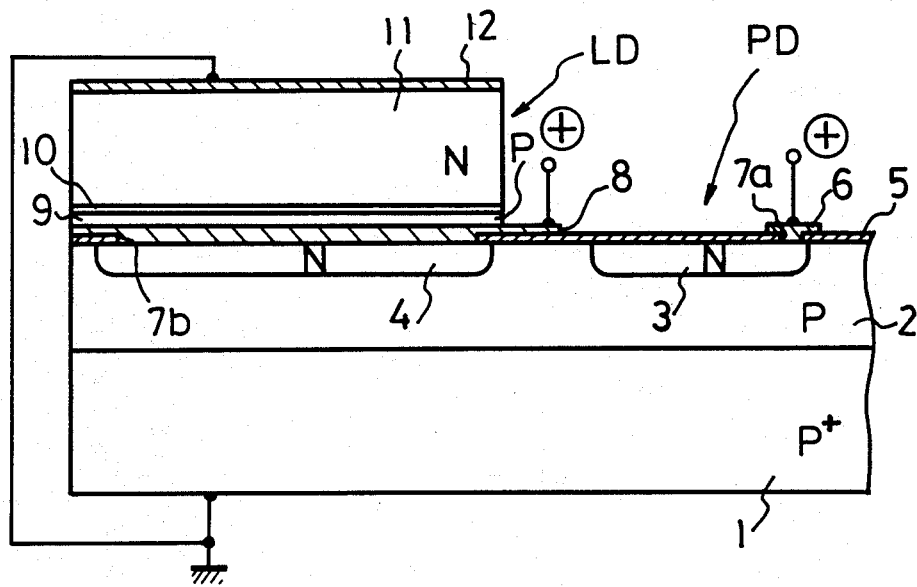
FIG. 4A is a cross-sectional view of one embodiment of a semiconductor laser of this invention.
Figure 4B:
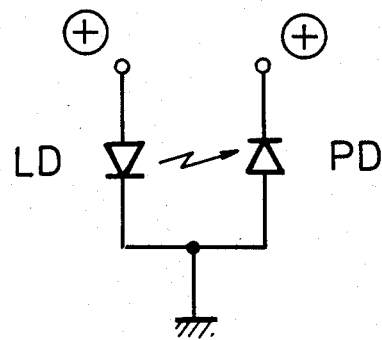
FIG. 4B is a circuit diagram of the embodiment of FIG. 4A.

FIGS. 4A and 4B show a first embodiment of a semiconductor laser of this invention. In the cross-sectional view of FIG. 4A there are shown a P+-type semiconductor substrate 1 upon which a P-type epitaxially-grown layer 2 is formed. An N-type diffusion region 3 is selectively formed in the surface of the epitaxially-grown layer 2 and region 3 serves as the cathode of the photodiode PD. Also, an N-type diffusion region 4 is simultaneously formed at the same time as the diffusion region 3. An oxide film 5 is formed on the surface of the epitaxially-grown layer 2. An electrode film 6 is formed and is connected to the N-type diffusion region 3 through a window 7a in the oxide film 5. An electrode film 8 is formed which is connected to the N-type diffusion region 4 through a window 7b in the oxide film 5. The laser diode LD is bonded on to the electrode film 8.

A P-type layer 9 of the laser diode LD bonded to the electrode film 8. An active layer 10, an N-type substrate 11, and an electrode film 12 are formed as shown in FIG. 4A. The electrode film 12 is electrically connected to the P-type semiconductor substrate 1 with an electrical connecting lead. As a practical matter, an electrode film is formed which is in contact with the epitaxially-grown layer 2 through a window which is not shown, but is formed in the oxide film 5, and it is electrically connected to the electrode film 12 with an electrical connecting lead.

Thus, the semiconductor laser , as shown in FIG. 4B, has a circuit construction in which the cathode of the laser diode LD and the anode of the monitoring photodiode PD are connected together. If a positive potential (for example, +5V) is applied to the electrode film 8 of the laser diode LD and to the electrode film 6 of the photodiode PD and a negative potential is applied to the semiconductor substrate 1, the laser diode LD and photodiode PD will be supplied with forward and reverse voltages, respectively, from a single power supply. Therefore, the photodiode PD which is supplied with a reverse voltage will produce a sufficiently large light energy detected output and an operational amplifier OPA for amplification will not be required.

Also, in the semiconductor laser which is shown in FIG. 4A only the N-type diffusion regions 3 and 4 are required to be formed in the surface of the P-type epitaxially-grown layer 2, and these two diffusion regions 3 and 4 can be formed at the same time. Consequently, the semiconductor laser according to this invention requires a smaller number of manufacturing steps than are required to construct a conventional device such as shown in FIG. 1A. This results in a reduced manufacturing cost.

FIG. 5 is a cross-sectional view of a second embodiment of a semiconductor laser of the invention. In this semiconductor laser, the substrate 1 of the laser diode LD is P-type and a P+-type diffusion region 2a instead of an N-type diffusion layer is formed in the region of the epitaxially-grown layer 2 to which the laser diode LD is to be bonded. The diffusion region 2a is not necessarily required.

The electrode film 12 of the laser diode LD is not connected to one side of the semiconductor substrate but serves as an independent anode electrode.

In the semiconductor laser of this invention show in FIG. 5, the elements similar to the laser shown in FIG. 4, such as the cathode of the laser diode LD and the anode of the monitoring photodiode PD are connected together. Thus, the same operation can be achieved in the embodiment of FIG. 5 as in the laser shown in FIG. 4.

As described above, a semiconductor laser of the invention comprises a laser diode, a monitoring photodiode for detecting the output light from the laser diode, and has three terminals including a terminal to which are connected the anode of either the laser diode or the monitoring photodiode and the cathode of the other, a terminal for the laser diode on the side which is opposite to the monitoring photodiode and a terminal for the monitoring photodiode which is on the side which is opposite to the laser diode.

Thus, according to the semiconductor laser of this invention, since one of the electrode of the laser diode is connected to a different electrode of the monitoring photodiode, it is possible to supply a forward voltage to the laser diode and a reverse voltage to the photodiode from a single power supply and if one electrode (for example, the cathode) of the power supply is connected to the common terminal between the laser diode and the monitoring photodiode and if the potential of the other electrode (for example, the anode) of the power supply is connected to the terminal of the laser diode on the side which is opposite to the monitoring photodiode and to the terminal of the monitoring photodiode on the side which is opposite to the laser diode.

This description is given for preferred embodiments of the invention but it will be apparent that many modifications and variations may be effected by one skilled in the art without departing from the spirit or scope of the novel concepts of the invention so that the scope of the invention should be determined only by the appended claims.

We claim as our invention:

1. A semiconductor chip which may be formed monolithically comprising: a semiconductor laser diode which has an anode region and a cathode region; a monitoring photodiode which has an anode region and a cathode region and monitors the laser light energy emitted by said laser diode; a terminal connected to the anode region of one of said diodes and to the cathode region of the other of said diodes; and terminals connected to the remaining anode region and the remaining cathode region.

2. A semiconductor chip comprising: a semiconductor body which has a major surface; a semiconductor laser which has an anode region and a cathode region and is attached on a first portion of said major surface of said semiconductor body; a monitoring photodiode which has an anode region and a cathode region and has a light receiving area formed on a second portion of said semiconductor body so as to monitor laser light energy emitted by said semiconductor laser diode; a common terminal connected to the anode region of one of said diodes and to the cathode region of the other of said diodes; and terminals connected to the remaining anode region and to the remaining cathode region and said monitoring photodiode and said semiconductor laser formed separately on said first and second portions of said substrate.

3. A semiconductor chip comprising: a semiconductor substrate which has a first conductivity type and has a major surface, a first semiconductor region which has a second conductivity type formed on top of said major surface and formed at a first portion of said surface as said semiconductor substrate; a second semiconductor region which has a second conductivity type formed of top of said major surface at a second portion of said major surface of said semiconductor substrate; a first electrode provided on said first semiconductor region; a second electrode provided on said second semiconductor region; a semiconductor laser diode bonded on said first electrode and said laser diode has an active region which is between an anode region and a cathode region; and said anode region of said semiconductor laser diode connected to said first electrode and said cathode region of said semiconductor laser diode connected to said semiconductor substrate.

4. A semiconductor chip comprising: a semiconductor substrate which has a first conductivity type and has a major surface; a first semiconductor region which has a second conductivity type formed on top of said semiconductor substrate at a first portion of said semiconductor substrate; a first electrode provided on a second portion of said semiconductor substrate; a second electrode connected to said first semiconductor region; a semiconductor laser diode bonded to said first electrode and said laser diode has an active region which is between an anode region and a cathode region, said cathode region of said semiconductor laser connected to said first electrode; and a third electrode connected to said anode region of said semiconductor laser diode.

* * * * *